United States Patent [19]

DesMarais, Jr.

[11] Patent Number: 4,664,962
[45] Date of Patent: May 12, 1987

[54] PRINTED CIRCUIT LAMINATE, PRINTED CIRCUIT BOARD PRODUCED THEREFROM, AND PRINTED CIRCUIT PROCESS THEREFOR

[75] Inventor: Raymond C. DesMarais, Jr., Littleton, Mass.

[73] Assignee: Additive Technology Corporation, Chelmsford, Mass.

[21] Appl. No.: 720,975

[22] Filed: Apr. 8, 1985

[51] Int. Cl.⁴ .................. H05K 1/00; B32B 3/10; G03C 5/00; G03C 5/04
[52] U.S. Cl. ..................... 428/137; 428/209; 428/901; 156/633; 156/650; 174/68.5; 430/311; 430/313; 430/315; 430/323; 430/331; 430/396
[58] Field of Search ............ 430/311, 313, 314, 315, 430/316, 317, 318, 323, 324, 325, 331, 396; 156/633, 634, 650, 652; 428/137, 209, 901; 174/68.5

[56] References Cited

U.S. PATENT DOCUMENTS

| | | | |
|---|---|---|---|
| 3,384,957 | 5/1968 | Shannon | 29/626 |
| 4,045,863 | 9/1977 | Mitterhammer et al. | 29/588 |
| 4,366,229 | 12/1982 | Freeman | 430/312 |
| 4,436,583 | 3/1984 | Saiki et al. | 156/659.1 |
| 4,512,829 | 4/1985 | Ohta et al. | 156/659.1 |

FOREIGN PATENT DOCUMENTS 0103337 6/1984 Japan .

OTHER PUBLICATIONS

IBM Technical Disclosure Bulletin, vol. 12, No. 10, Mar. 1970, Zipay et al, Fabrication on Multilayered Structures.

Primary Examiner—John E. Kittle
Assistant Examiner—Patrick J. Ryan
Attorney, Agent, or Firm—Morse, Altman & Dacey

[57] ABSTRACT

A novel printed circuit laminate product and process are provided for use in connection with a printed circuit board. The laminate is composed of a polyimide support stratum, a copper electrical conductor stratum, and an intermediate adhesive stratum. In one form, the opposite faces of the laminate are separately etched to provide different circuit related features and the laminate as an entirety has through holes, which have particular cross sectional geometry and which are produced by particular process steps. In another form, the copper stratum is laminated to the adhesive face of the adhesive and support strata and is etched after through holes have been drilled in the adhesive and support strata. The geometry is such that the diameter of a through hole in a conducting portion of the conducting stratum is smaller than the diameter of the through hole in the adhesive and support strata, so as to provide a conducting rim or flange for ease and security of mechanical and electrical connection to an associated electrical lead wire or grommet incorporated in a circuit on the object substrate below. The final product of the present invention is a printed circuit structure comprising one or more laminates of the foregoing type, bonded to a rigid printed circuit board.

2 Claims, 5 Drawing Figures

4,664,962

PRINTED CIRCUIT LAMINATE, PRINTED CIRCUIT BOARD PRODUCED THEREFROM, AND PRINTED CIRCUIT PROCESS THEREFOR

BACKGROUND OF THE INVENTION

1. Field of the Invention

The present invention relates to printed circuit products and processes and, more particularly, to a printed circuit intermediate product that is useful in the production or modification of printed circuits, and in processes therefor.

2. The Prior Art

Ordinarily, a printed circuit board is clad on one or both sides with copper in which are chemically etched conductor patterns and to which are soldered electronic components that are carried by the printed circuit board. In the case of complex circuits, multilayer printed circuits have been assembled from interleaved conducting and insulating laminates. Typically, the printed circuit board is provided with holes into which leads from the electrical components are soldered for electrical connection to the conductors and mechanical connection to the board. When circuit changes are made in electronic equipment, it often is less expensive to modify existing circuit boards than to replace them with new circuit boards. Such modifications typically involve drilling holes to sever selected existing electrical connections and to mount new electronic components and adding new conductors either by manual wiring or by printing on old or new insulating strata. In the past, such conventional modification procedures have involved shipment of relatively bulky circuit boards between the equipment site and a circuit board processing plant, during a period of time in which the equipment might remain idle. Such prior art procedures have been unwieldy, time consuming, and susceptible to avoidable errors. The present invention contemplates new products and processes, by which superior construction and modification are feasible. Ultimate products incorporating circuit laminates of the present invention enable the use of a "bed of nails" testing fixture. These processes are faster than prior manual installation of discrete wires because they involve a single parallel step, rather than a series of sequential steps.

SUMMARY OF THE INVENTION

The primary object of the present invention is to provide a novel printed circuit laminate, for bonding to a printed circuit board. The laminate is composed of a polyimide support stratum, a copper electrical conductor stratum, and an intermediate adhesive stratum. In one form, the opposite faces of the laminate are separately etched to provide different circuit related features and the laminate as an entirety has through holes, which have particular cross sectional geometry and which are produced by particular process steps. In another form, the copper stratum is laminated to the adhesive face of the adhesive and support strata and is etched after through holes have been drilled in the adhesive and support strata. The geometry is such that the diameter of a through hole in a conducting portion of the conducting stratum is smaller than the diameter of the through hole in the adhesive and support strata, so as to provide a conducting rim or flange for ease and security of mechanical and electrical connection to an associated electrical lead wire or grommet incorporated in a circuit on the object substrate below.

The process steps are such that a pattern of solid and open regions is produced in the adhesive and polyimide support strata by drilling or etching before or after lamination of the copper stratum thereto, and a pattern of solid and open regions is produced in the copper stratum by etching following its lamination. Following establishment of the aforementioned geometry, and the removal of all masking by which the etching has been effected, the conducting portions are tinned to provide the aforementioned laminate for solder bonding to a rigid printed circuit board. The arrangement is such that: the composition of the masks is inert to the etchants for the conductor, adhesive and support strata; the copper of the conductor stratum is inert to any etchant for the adhesive and support strata; and the adhesive and support strata are inert to the etchant for the copper stratum.

The final product of the present invention is a printed circuit structure comprising one or more laminates of the foregoing type, bonded to a rigid printed circuit board.

Other objects of the present invention will in part be obvious and will in part appear hereinafter.

For a fuller understanding of the nature and objects of the present invention reference is made to the accompanying drawings wherein.

DETAILED DESCRIPTION OF THE PREFERRED EMBODIMENTS

Figure 1:
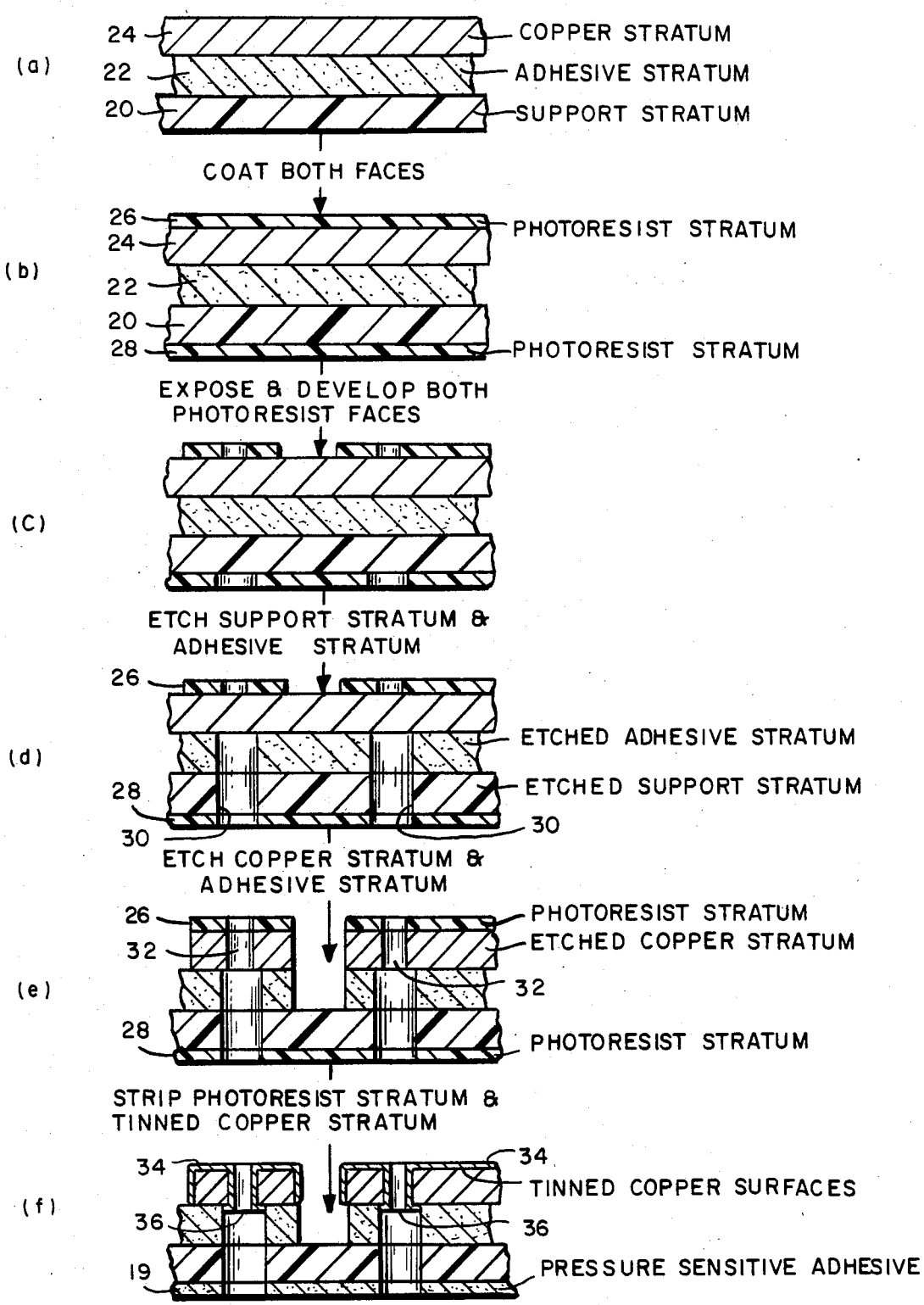
FIG. 1 is a flow diagram of a process of the present invention, illustrating steps and materials involved, and an intermediate product produced thereby, the materials and product being shown in exaggerated cross section

Generally, in the form of the invention shown in FIG. 1(a), the starting laminate of the present invention includes a support stratum 20, an intermediate adhesive stratum 22, and an electrically conductive stratum 24. Preferably, support stratum 20 is composed of a polyimide polymer, ranging in thickness from 1.0 to 5.0 mil, of the type sold by duPont under the trade designation KAPTON film. This polyimide polymer is the result of a polycondensation reaction between an aromatic terabasic acid and an aromatic diamine. Preferably, copper stratum 24 ranges in thickness from 0.5 to 2.5 mils. Preferably, adhesive stratum 22, which is composed of a polyester resin having a fusing or sealing temperature ranging from 250°–320° F., ranges in thickness from 0.5 to 2.0 mil.

As shown in FIG. 1(b), first the opposite faces of the laminate of FIG. 1(a) are coated with photoresist strata 26, 28. Preferably, these photoresist strata are composed of an ultraviolet radiation sensitive photopolymer, such as that sold by Eastman-Kodak under the trade designation KPR, ranging in thickness from 0.01 to 1.0 mil. Next the opposite faces of the laminate are exposed sequentially to ultraviolet radiation through so-called "phototools." Such phototools, as is conventional, are photographic diazo positive transparencies produced from silver halide negatives. These positive transparencies have precision configurations representing electrically conductive regions, e.g. pads (electrical connector locations) and lines (electrical leads), as well as electrically non-conductive regions. Development involves immersing the laminate in a developing solution, such as that sold by Eastman Kodak under the trade designation KPR developer, by which solid portions corresponding to electrically conductive regions are retained and other portions corresponding to electrically non-conductive regions are dissolved, as shown in FIG. 1(c). A typical developer is a low molecular weight aliphatic liquid. When dried, as by baking at suitable moderate temperature and low humidity, the configurations in the photoresist strata are, in effect, stencils.

As shown in FIG. 1(d), next, support stratum 20 is etched through photoresist stratum 28 to produce holes 30, and then, as shown in FIG. 1(e), copper stratum 24 is etched through photoresist stratum 26 to produce holes 32 that are registered with holes 30, as well as to produce related solid conducting (copper) and open non-conducting regions. Etching of support stratum 28 is by a basic alkali metal hydroxide in an aqueous low molecular weight alcohol solution, to which copper stratum 24 is substantially inert. Etching of copper stratum 24 is by an acidic alkali metal persulfate solution, to which support stratum 20 is substantially inert.

Then, as shown in FIG. 1(f), the residual portions of photoresist strata 26, 28 are removed from the laminate by immersing in a suitable acidic stripping solution, typically, an aqueous acid and organic solvent solution. And, finally, the copper configuration, as at 34, and copper rim, as at 36, are tinned by contact with molten solder applied by suitable rollers to both faces. The resulting intermediate product, as shown in FIGS. 1(f) and 2, can be shipped from the printed circuit plant to the printed circuit board situs, or, alternatively, can be embodied as a component in a newly fabricated circuit board. A pressure sensitive adhesive layer 19, for example, a urethane acrylate oligomer of the type sold under the trade designation FR25044 by Acheson Colloids Company, Fort Huron, Mich., is selectively screen printed on the outer face of polyimide stratum 20 and is cured via ultraviolet radiation. The assemblage then is aligned to the object substrate, and is bonded thereto in a suitable vacuum laminator. Subsequent termination of the conductors of the laminate to the conductors of the object stratum is accomplished via reflow of the solder already interposed between adjacent conductor faces.

The following non-limiting example will further illustrate the process and product of the present invention.

EXAMPLE 1

In one preferred example, the following specific steps result in the following specific product. In the starting laminate, the support stratum is composed of a polyimide polymer approximately 1.0 mil thick, the intermediate stratum is composed of a polyester resin approximately 1.5 mil thick, and the electrically conducting stratum is composed of commercial grade copper approximately 1.5 mil thick. First, both faces of the laminate are cleaned with dilute HCl (10% solution by volume), rinsed with clean water and dried. Next, both faces of the laminate are roll coated with an organic solvent solution of the KPR photoresist to produce opposed photosensitive photoresist strata that are approximately 0.1 mil thick. Next, the laminate is run through an infrared (or other) dryer for a tack dry period. Thereafter, the laminate is further dried for 10 minutes at 80° C. in a convection oven, after which it is allowed to cool to room temperature. Next, both faces of the laminate are exposed to ultraviolet light through contacting diazo phototools to provide electronically related latent configurations. The phototools are positive transparencies having precision configurations representing electrically conductive regions, e.g., pads (electrical connector locations) and lines (electrical leads), and electrically non-conductive regions. When the KPR strata, which are "negative working," are exposed to radiation through the phototools, cross linking or polymerization occurs in the areas that are struck by UV light. The images formed by the UV light and defined by the clear areas of the transparency are insoluble in the developing bath. Opaque areas of the transparency act as a mask and allow those portions that have received no exposure to be dissolved by the developer. Next, the laminate is immersed in KPR developer, which is a trichloroethylene solution, for about 1 minute and then rinsed gently in a stream of warm water. The soluble unexposed portions wash away, leaving a tough, chemically resistant developed images in minute relief on the surfaces of the laminate. Next, the laminate again is baked in a convection oven for a period of 10 minutes at 120° C. Next the polyimide support stratum is etched through its associated photoresist mask by immersion in a solution consisting, by total weight, of 85% ethanol (200 proof), and 15% of a 1 normal solution of aqueous potassium hydroxide, at 70° C. for 6 to 10 minutes. The laminate then is rinsed with water and the support stratum side of the laminate is blasted with a stream of water to remove residual adhesive. Next, the copper stratum is etched through its associated photoresist mask by immersion for 6 to 12 minutes in a 70° C. solution of sodium persulfate, prepared by mixing 1.75 pounds of solid with 1 gallon of water and 5 milliliters of sulfuric acid. Next, the photoresist strata are stripped from the laminate by immersing in an aqueous solution of hydrochloric acid and methyl chloride. Next, the laminate is run through an infrared or warm air drier for a period of 10 minutes at 80° C. Then the laminate is roll coated on both sides with molten solder in order to tin exposed copper areas of the conductive stratum.

EXAMPLE 2

The process of EXAMPLE 1 is repeated except that, instead of tinning the copper stratum by contact with molten solder, the copper stratum is coated with a metallic pre-alloyed "ink" and heated to fusion temperature. In one form the metallic ink is a mixture, by total weight, of a flux vehicle—15%, and a 270 mesh 60%/40% (by total weight) tin/lead powder—85%, at a sufficient temperature to fuse the solder to the copper.

EXAMPLE 3

Figure 3:
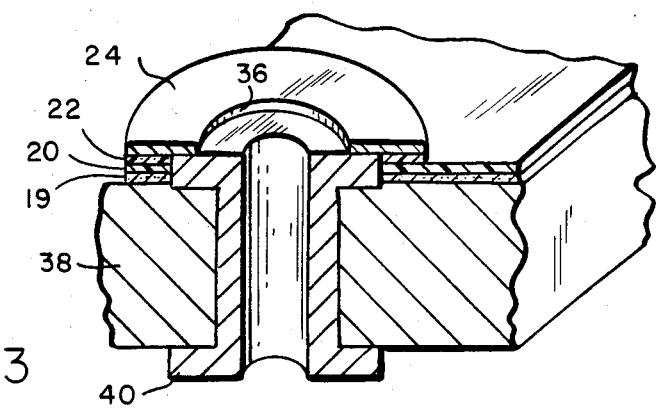
FIG. 3 is a further exaggerated perspective view, illustrating certain features of the product of FIGS. 1 and 2.

The process of EXAMPLE 1 is repeated to produce a laminate having electrically conductive pads (with holes) and lines in the copper stratum, and holes in the support stratum. Holes in the support stratum are aligned with holes in the conductive stratum, the holes in the conductive stratum being smaller in diameter than the holes in the support stratum. Free areas of the copper are tinned. FIG. 3 shows a phenolic circuit board at 38, provided with openings and grommets at 40, and the pressure sensitive adhesive shown at 19. This circuit board is registered with the laminate and bonded thereto in a vacuum laminator at the fusing temperature of the adhesive layer 19. Rim 36 contacts a flange of metal grommet 40 and is fused thereto by a superheated jet of air at 1,400° to 1,500° C.

Figure 4:
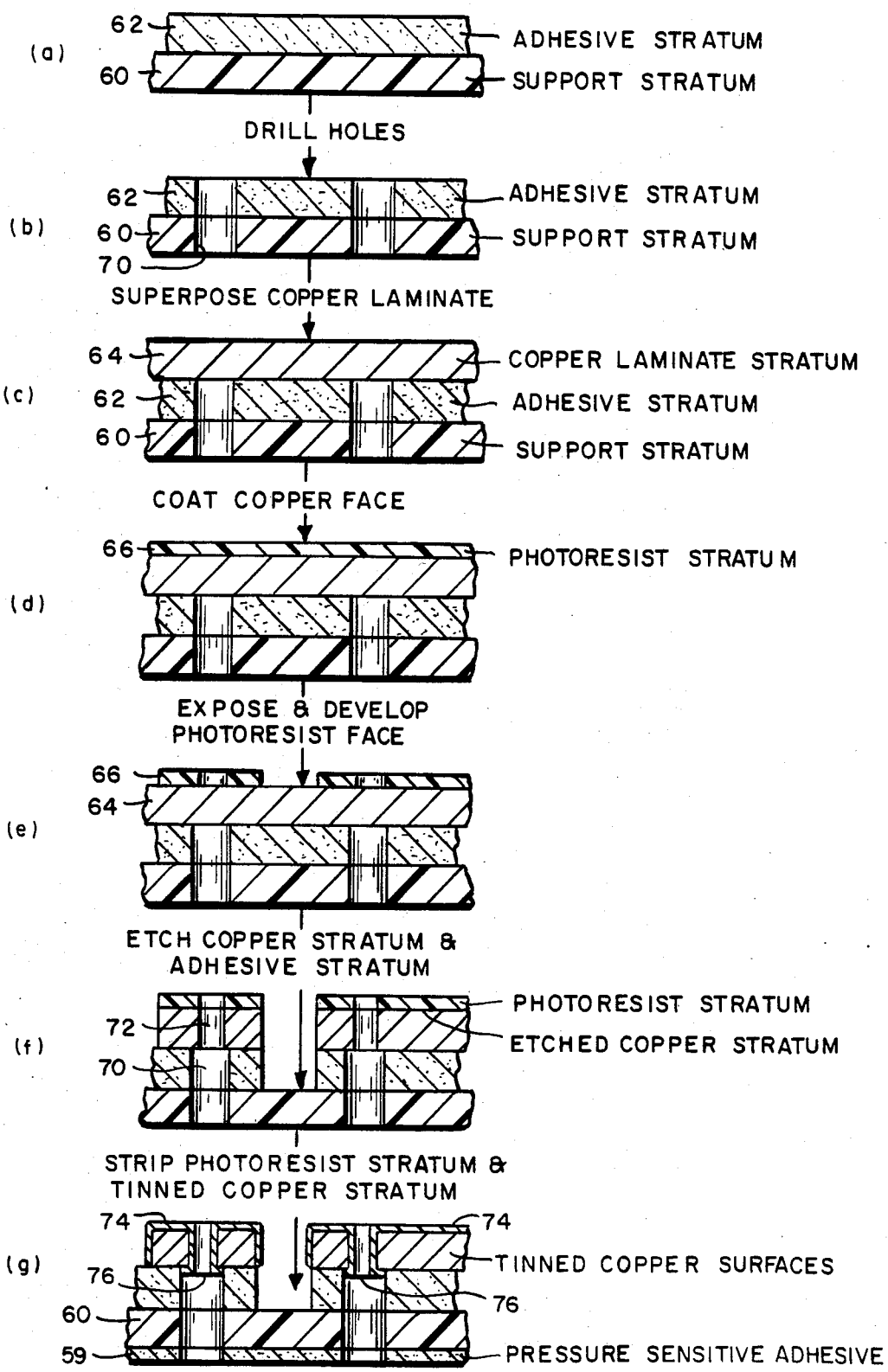
FIG. 4 is a flow diagram of another process of the present invention, illustrating steps and materials involved, and an intermediate product produced thereby, the materials and product being shown in exaggerated cross section.

Generally, in the form of the invention shown in FIG. 4 the starting laminate, as shown in FIG. 4(a), includes a support stratum 60 and an adhesive stratum stratum 62. Preferably, support stratum 60 corresponds in chemical composition and physical thickness to support stratum 20 and adhesive stratum 62 corresponds in chemical composition and physical thickness to adhesive stratum 22. As shown in FIG. 4(b), first, holes and other reticulations 70 are drilled or otherwise machined into assemblage 60,62. Thereafter, as shown in FIG. 4(c), copper stratum 64 is laminated thereto under heat and pressure within a suitable laminator press. Copper stratum 64 is similar in physical thickness to copper stratum 24 of FIG. 1.

Next, as shown in FIG. 4(d), the free face of copper stratum 64 is coated with photoresist stratum 66. Preferably, this photoresist stratum has a chemical composition and physical thickness like that of photoresist stratum 26. Next, photoresist stratum 66 is exposed to ultraviolet radiation through a phototool. Such a phototool, as is conventional, is a photographic diazo positive transparency produced from a silver halide negative. Such a positive transparency has a precision configuration representing electrically conductive regions, e.g. pads and lines, as well as electrically non-conductive regions. Development involves immersing the laminate in a developing solution, such as that specified in connection with the development of photoresist stratum 26, by which solid portions corresponding to electrically conductive regions are retained and other portions corresponding to electrically non-conductive regions are dissolved. When dried, as by baking at suitable moderate temperature and low humidity, the configurations in the photoresist strata are, in effect, stencils.

Next, as shown in FIGS. 4(e) and 4(f), copper stratum 64 is etched through photoresist stratum 66 to produce holes 72 that are registered with holes 70, as well as to produce related solid copper regions and open non-conducting regions. Etching of copper stratum 64 is by an alkali metal persulfate solution at an acidic pH, to which support stratum 20 is substantially inert. The residual adhesive at 62 can be removed by subjection to the polyimide etchant.

Figure 2:
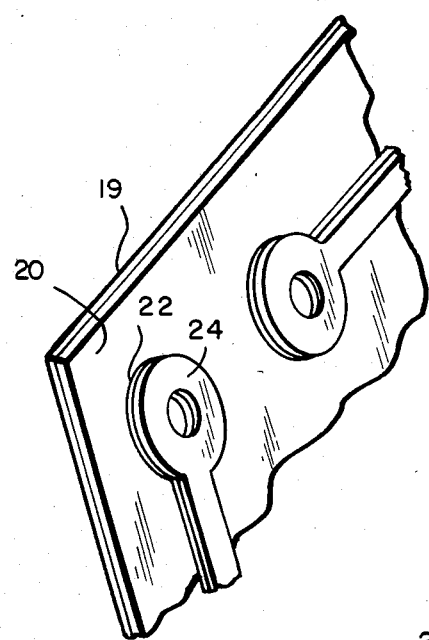
FIG. 2 is a broken away, perspective view, distorted for illustrative purposes, of the product of FIG. 1.

Then, as shown in FIG. 1(g), the residual portions of photoresist stratum 66 are removed from the laminate by immersing in a suitable acidic stripping solution of the type referred to in connection with FIG. 1. And, finally, the copper configuration, as at 74, and copper rim, as at 76, are tinned by contact with molten solder applied by suitable rollers to both faces. The resulting intermediate product, as shown in FIGS. 1(f) and 2, can be shipped from the printed circuit plant to the printed circuit board situs, or, alternatively, can be embodied as a component in a newly fabricated circuit board. A pressure sensitive adhesive layer 59 is selectively screen printed on the outer face of polyimide stratum 60 and is cured via ultraviolet radiation. The assemblage then is aligned to the object substrate, and is bonded thereto in a suitable vacuum laminator. Subsequent termination of the conductors of the laminate to the conductors of the object stratum is accomplished via reflow of the solder already interposed between adjacent conductor faces.

The following non-limiting example will further illustrate the process and product of the present invention.

EXAMPLE 4

In another preferred example, the following specific steps result in the following specific product. In the starting laminate, the support stratum is composed of a polyimide polymer approximately 1.0 mil thick, the adhesive stratum is composed of a polyester resin approximately 1.5 mil thick, and the electrically conducting stratum is composed of commercial grade copper approximately 1.5 mil thick. First, a pattern of solid and open regions is produced in the adhesive and polyimide support strata by drilling or other machining. Next, laminate 60, 62 is cleaned with dilute HCl (10% solution by volume), rinsed with clean water and dried. Next, copper stratum 64 is laminated to adhesive stratum 62, which then is coated by immersion in an organic solvent solution of the KPR photoresist to produce a photosensitive photoresist strata that is approximately 0.1 mil thick. Next, the laminate is run through an infrared (or other) dryer for a period of 10 minutes at 80° C., after which it is allowed to cool to room temperature. Next, face 66 of the laminate is exposed to ultraviolet light through a contacting diazo phototool to provide an electronically related latent configuration. The phototool is a positive transparency having a precision configuration representing electrically conductive regions, e.g., pads and lines, and electrically non-conductive regions. When the KPR stratum, which is "negative working," is exposed to radiation through the phototool, cross linking or polymerization occurs in the areas that are struck by UV light. The image formed by the UV light and defined by the clear areas of the transparency are insoluble in the developing bath. Opaque areas of the transparency act as a mask and allow those portions that have received no exposure to be dissolved by the developer. Next, the laminate is immersed in KPR developer, which is a trichloroethylene solution, for about 1 minute and then rinsed gently in a stream of warm water. The soluble unexposed portions wash away, leaving a tough, chemically resistant developed images in minute relief on the surfaces of the laminate. Next, the laminate again is run through an infrared or warm air dryer for a period of 10 minutes at 80° C. Next, the copper stratum is etched through its associated photoresist mask by immersion for 6 to 12 minutes in a 70° C. solution of sodium persulfate, prepared by mixing 1.75 pounds of solid with 1 gallon of water and 5 milliliters of sulfuric acid. Next, the photoresist stratum is stripped from the laminate by immersing in an aqueous solution of hydrochloric acid and methyl chloride. Next, the laminate again is run through an infrared or other warm air drier for a period of 10 minutes at 80° C. Then the laminate is roll coated on both sides with molten solder in order to tin exposed copper areas of the conductive stratum. Finally, the face of the polyimide support stratum is screen printed with a pattern of pressure sensitive adhesive composed of a urethane acrylate oligomer and the entire laminate is bonded thereby to a printed circuit board.

Figure 5:
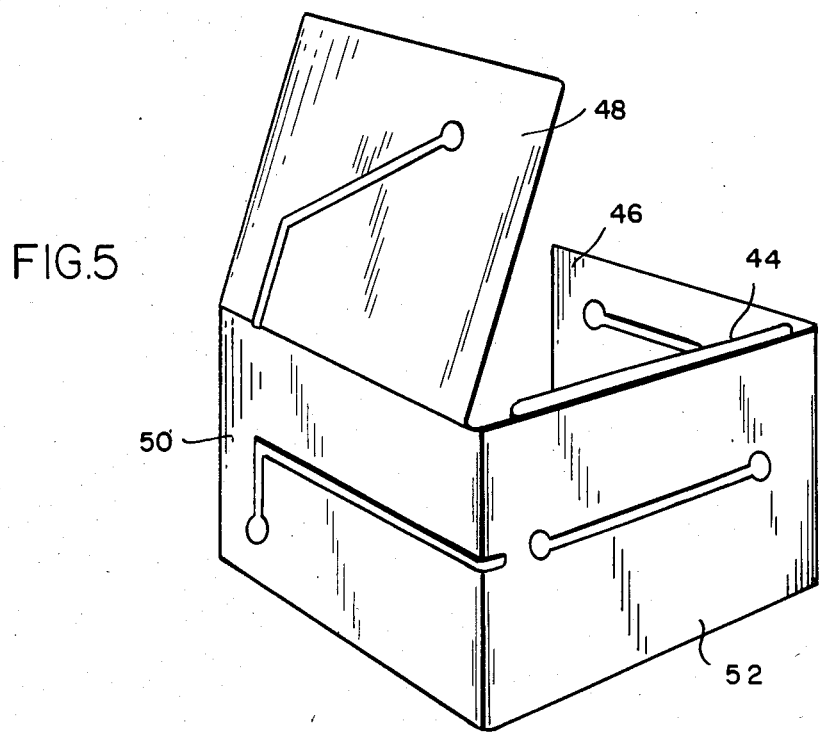
FIG. 5 illustrates another product of the present invention.

An exploded drawing of a multilayer configuration according to the present invention is shown in FIG. 5 as comprising a printed circuit board 44, three laminates 46, 48, 50 bonded to one face of circuit board 44, and one laminate 52 bonded to the other face of circuit board 44. Laminates 46, 48, 50, 44 are of the type produced by the processes of EXAMPLES 1 and 4.

Since certain changes may be made in the present disclosure without departing from the scope of the present invention, it is intended that all matter described in the foregoing specification or shown in the accompanying drawings be interpreted in an illustrative and not in a limiting sense.

What is claimed is:

1. A printed circuit board comprising a rigid substrate and at least one laminate bonded to at least one surface thereof, said laminate including:
   (a) a polymeric support stratum,
   (b) an adhesive intermediate stratum, and
   (c) a copper electrical conductor stratum having conducting regions and nonconducting regions including at least a hole,
   (d) said laminate having at least one hole chemically etched through said conducting portion of said conductor stratum and through said support stratum,
   (e) the diameter of said hole in said conducting portion of said conducting stratum being smaller than the diameter of said hole in said support stratum, said conducting portion of said conductor stratum thereby providing a conducting flange for ease of mechanical and electrical connection to an associated electrical lead wire,
   (f) said support stratum being composed of a polyimide polymer,
   (g) said support stratum ranging in thickness from 1.0 to 5.0 mil,
   (h) said adhesive stratum being a polyester resin,
   (i) said adhesive stratum ranging in thickness from 0.5 to 2.0 mil,
   (j) said conductor stratum having conducting portions that are composed of copper,
   (k) said conductor stratum ranging in thickness from 0.5 to 2.5 mil,
   (l) exposed copper areas being tinned.

2. A process for manufacturing a printed circuit from a starting laminate including a support stratum composed of a polyimide polymer approximately 1.0 mil thick, an intermediate stratum composed of a polyester resin approximately 1.5 mil thick, and an electrically conducting stratum composed of commercial grade copper approximately 1.5 mil thick, said process comprising the steps of:
   (a) coating both faces of said laminate by immersion in an organic solvent solution of a KPR photoresist to produce opposed photosensitive photoresist strata,
   (b) exposing both faces of the laminate to ultraviolet light through contacting phototools to provide electronically related latent configurations representing electrically conductive regions including pads and lines, and electrically non-conductive regions,
   (c) developing said latent image in a trichloroethylene bath to produce masks in the form of developed images in minute relief on said surfaces,
   (d) etching said polyimide support stratum through its associated mask by subjection to an aqueous alcohol hydroxide formulation,
   (e) etching said copper stratum through its associated mask by subjection to an alkali metal persulfate formulation,
   (f) stripping the photoresist strata from the laminate by subjection to a aqueous acid, halogen substituted low molecular weight alcohol formulation, and
   (g) treating free portions of the copper of the conductive stratum for welding enhancement,
   (h) said step of treating for welding enhancement being effected by tinning exposed copper area.

* * * * *